United States Patent
Kim et al.

(10) Patent No.: US 9,468,094 B2
(45) Date of Patent: Oct. 11, 2016

(54) FOLDABLE DISPLAY APPARATUS AND METHOD OF MANUFACTURING THE SAME

(71) Applicant: Samsung Display Co., Ltd., Yongin (KR)

(72) Inventors: Youn Joon Kim, Seoul (KR); Cheolsu Kim, Seoul (KR); Young Sik Yoon, Seoul (KR); Sangjo Lee, Hwaseong-si (KR); Jiwon Han, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 122 days.

(21) Appl. No.: 14/094,165

(22) Filed: Dec. 2, 2013

(65) Prior Publication Data
US 2015/0029683 A1  Jan. 29, 2015

(30) Foreign Application Priority Data
Jul. 24, 2013 (KR) ................. 10-2013-0087545

(51) Int. Cl.
*H05K 1/02* (2006.01)
*H01L 27/32* (2006.01)
*H01L 51/00* (2006.01)

(52) U.S. Cl.
CPC ............. *H05K 1/028* (2013.01); *H01L 27/326* (2013.01); *H01L 51/0097* (2013.01); *Y02E 10/549* (2013.01); *Y02P 70/521* (2015.11); *Y10T 29/49* (2015.01)

(58) Field of Classification Search
CPC ............. H01L 27/326; H01L 51/0097; Y02E 10/549; Y02P 70/521; H05K 1/028; Y10T 29/49
USPC .............................................. 349/158
See application file for complete search history.

(56) References Cited

U.S. PATENT DOCUMENTS

| | | | |
|---|---|---|---|
| 7,898,501 B2 | 3/2011 | Jang et al. | |
| 2006/0186316 A1* | 8/2006 | Miyashita et al. | 250/208.1 |
| 2007/0262916 A1* | 11/2007 | Kee | G02F 1/13336 345/1.3 |
| 2010/0117928 A1 | 5/2010 | Shim et al. | |
| 2010/0270917 A1* | 10/2010 | Chuang | G02F 1/133305 313/505 |
| 2012/0062447 A1 | 3/2012 | Tseng et al. | |
| 2012/0147599 A1 | 6/2012 | Shim et al. | |

FOREIGN PATENT DOCUMENTS

| | | |
|---|---|---|
| JP | 11-109324 | 4/1999 |
| JP | 2002-098941 | 4/2002 |
| JP | 2002-229485 | 8/2002 |
| JP | 2005-003990 | 1/2005 |
| JP | 2010-266777 | 11/2010 |
| KR | 10-2012-0034506 | 4/2012 |
| KR | 10-1217554 | 1/2013 |

* cited by examiner

*Primary Examiner* — Charles Chang
(74) *Attorney, Agent, or Firm* — H.C. Park & Associates, PLC

(57) ABSTRACT

A display apparatus includes a flexible substrate, first pixels, and second pixels. The flexible substrate includes: a first area at least partially bent about an axis; and at least one non-bent area. The first pixels are disposed in the first area. The second pixels are disposed in the at least one non-bent area. Respective widths of each first pixel in a first direction are smaller than respective widths of each second pixel in the first direction.

18 Claims, 3 Drawing Sheets

FOLDABLE DISPLAY APPARATUS AND METHOD OF MANUFACTURING THE SAME

CROSS-REFERENCE TO RELATED APPLICATION

This application claims priority from and the benefit of Korean Patent Application No. 10-2013-0087545, filed on Jul. 24, 2013, which is incorporated by reference for all purposes as if set forth herein.

BACKGROUND

1. Field

Exemplary embodiments relate to a foldable display apparatus and a method of manufacturing the same, and, more particularly, to a foldable display apparatus having improved display quality and a method of manufacturing the same.

2. Discussion

Conventional foldable displays are typically formed by depositing, for example, organic light emitting materials on a flexible display substrate. In this manner, a foldable display apparatus may be folded, bent, rolled, or otherwise deformed (hereinafter collectively referred to as "bent") to a designed limit radius of curvature. As such, a foldable display apparatus may include a bent (or flexed) area including at least one bend and a non-bent area that does not include at least one bend. Pixels may be formed in each of the bent and non-bent areas. It is noted that each of the pixels may include a thin film transistor and electrodes, each of which are vulnerable to defects related to bending forces. As such, when a flexible display substrate is bent, cracks may occur in one or more components of the pixels formed in the bent area. To this end, when distances between the pixels and the bending axis in a perpendicular direction are different, at least one line in a direction parallel to the bending axis may be observed.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a foldable display apparatus configured to prevent (or otherwise reduce) cracks in pixels formed in a bent area of the foldable display, as well as prevent (or otherwise reduce) the occurrence of visible lines in a direction substantially parallel to a bending axis of the bent area. In this manner, display quality may be improved.

Exemplary embodiments provide a method of manufacturing the foldable display apparatus.

Additional aspects will be set forth in the detailed description which follows and, in part, will be apparent from the disclosure, or may be learned by practice of the inventive concept.

According to exemplary embodiments, a display apparatus includes a flexible substrate, first pixels, and second pixels. The flexible substrate includes: a first area at least partially bent about an axis; and at least one non-bent area. The first pixels are disposed in the first area. The second pixels are disposed in the at least one non-bent area. Respective widths of each first pixel in a first direction are smaller than respective widths of each second pixel in the first direction.

According to exemplary embodiments, a display apparatus includes a flexible substrate, first pixels, second pixels, third pixels, and fourth pixels. The flexible substrate includes: a first area at least partially bent about a first axis; a second area at least partially bent about a second axis different from the first axis, a third area at least partially bent about each of the first axis and the second axis; and at least one non-bent area. The first pixels are disposed in the first area. The second pixels are disposed in the second area. The third pixels are disposed in the third area. The fourth pixels are disposed in the at least one non-bent area. Respective widths of each first pixel and each third pixel in the first direction are smaller than respective widths of each fourth pixel and each second pixel in a first direction. Respective widths of each second pixel and each third pixel in a second direction different from the first direction are smaller than respective widths of each fourth pixel and each first pixel in the second direction.

According to exemplary embodiments, a method includes: forming first pixels on a first portion of a flexible substrate; forming second pixels on a second portion of the flexible substrate; and bending the first portion of the flexible substrate at least partially about an axis. Respective widths of each first pixel in a first direction are smaller than respective widths of each second pixel in the first direction.

According to exemplary embodiments, a method includes: forming first pixels on a first portion of a flexible substrate; forming second pixels on a second portion of the flexible substrate; forming third pixels on a third portion of the flexible substrate; forming fourth pixels on a fourth portion of the flexible substrate; bending the first portion at least partially about a first axis; and bending the second portion at least partially about a second axis different from the first axis. Bending the first portion and bending the second portion bends the third portion at least partially about each of the first axis and the second axis. Respective widths of each first pixel and each third pixel in a first direction are smaller than respective widths of each fourth pixel and each second pixel in the first direction. Respective widths of each second pixel and each third pixel in a second direction different from the first direction are smaller than respective widths of each fourth pixel and each first pixel in the second direction.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
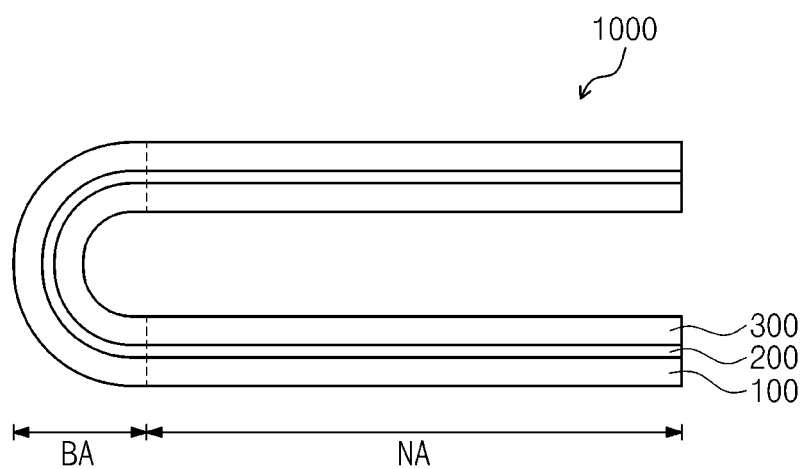
FIG. 1 is a sectional view of a foldable display apparatus, according to exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a sectional view of a foldable display apparatus, according to exemplary embodiments.

Referring to FIG. 1, a foldable display apparatus 1000 may be a flexible display apparatus, such as a flexible organic light emitting display apparatus. For descriptive and illustrative convenience, exemplary embodiments are described in association with an organic light emitting display apparatus implementation of the foldable display apparatus 1000. It is contemplated, however, that any other suitable form of foldable, bendable, flexible, or otherwise deformable display apparatus may be utilized.

According to exemplary embodiments, the foldable display apparatus 1000 includes a display substrate 100, a pixel layer 200, and an encapsulation substrate 300. Although specific reference will be made to this particular implementation, it is also contemplated that the foldable display apparatus 1000 may embody many forms and include multiple and/or alternative components and configurations.

The display substrate 100 may be a flexible insulating substrate form of any suitable material. The display substrate 100 may include a bending area BA where bending occurs, as well as at least one non-bending area NA where bending may not occur.

The pixel layer 200 may be disposed on the display substrate 100. The pixel layer 200 may include pixels to display an image. The pixels may be separated from one another. In this manner, an image may not be displayed in areas between adjacent pixels. Although not shown in the drawings, each of the pixels may include a thin film transistor (TFT), an anode, a hole injection layer, a hole transport layer, an organic emission layer, an electron transport layer, an electron injection layer, and a cathode.

The encapsulation substrate 300 may be disposed on the pixel layer 200 to face the display substrate 100. In this manner, the pixel layer 200 may be disposed between the display substrate 100 and the encapsulation substrate 300. In exemplary embodiments, the encapsulation substrate 300 may encapsulate and protect the pixel layer 200 from an external environment, e.g., dust, debris, gasses, impacts, etc. It is also noted that the encapsulation substrate 300 may be a flexible insulating substrate made of any suitable material.

Although not shown, the foldable display apparatus 1000 may further include at least one driving unit to provide a driving signal to the pixels. The driving unit may be mounted on a printed circuit board. The foldable display apparatus 1000 may also include at least one controller and one or more memories to facilitate the display of images.

Figure 2:
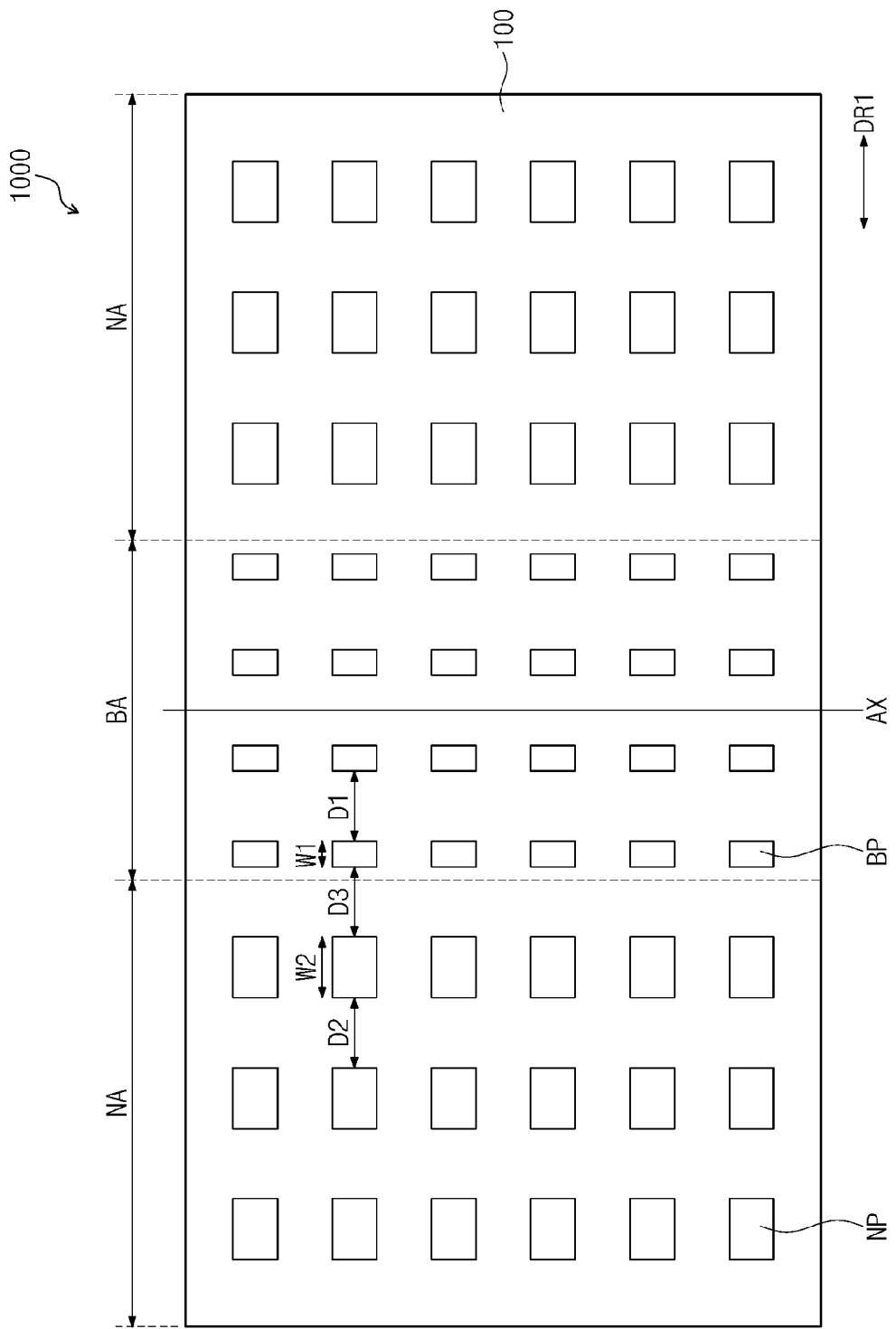
FIG. 2 is a plan view of the foldable display apparatus of FIG. 1, according to exemplary embodiments.

FIG. 2 is a plan view of the foldable display apparatus of FIG. 1, according to exemplary embodiments.

Referring to FIG. 2, the foldable display apparatus 1000 may be at least partially bent about a bending axis AX in, for example, a first direction DR1 perpendicular (or substantially perpendicular) to a direction in which the bending axis AX extends.

According to exemplary embodiments, the pixels may be configured to display at least one color, such as, for instance, red, green, blue, white, or any other suitable color. For example, the pixels may be arranged in RGB stripes of red, green, and blue pixels. To this end, each of the pixels may include at least two sub-pixels configured to display different colors from one another. Moreover, the pixels may include first pixels BP disposed in association with the bending area BA and second pixels NP disposed in association with at least one of the non-bending areas NA of the display substrate 100. Hereinafter, the first pixels BP may be referred to as bending pixels BP and the second pixels may be referred to as non-bending pixels NP; however, these monikers are not to be construed as connoting a bent/non-bent state of the pixels.

In exemplary embodiments, a width of each of the bending pixels BP in the first direction DR1 may be a first width W1, and a width of each of the non-bending pixels NP in the first direction DR1 may be a second width W2. The first width W1 may be smaller than the second width W2. For instance, a relation between the first width W1 and the second width W2 may satisfy Equation 1.

$$0.1 \times W2 \leq W1 \leq 0.9 \times W2 \qquad \text{Equation (1)}$$

A radius curvature of the bending area BA may be proportional to the first width W1. For example, as the radius curvature of the bending area BA becomes smaller, the first width W1 may become smaller.

It is noted that a higher probability of defects may otherwise occur in the bending pixels BP than the non-bending pixels NP. For example, as the bending area BA bends, cracks may occur in one or more of the TFTs, anodes, and/or cathodes of the bending pixels BP. In exemplary embodiments, however, since the first width W1 may be smaller than the second width W2, the bending pixels BP may be less stressed than the non-bending pixels NP or at least stressed less than if the widths of the bending pixels BP were the same as or greater than the widths of the non-bending pixels NP. As such, exemplary embodiments reduce the probability of defects occurring in the bending pixels BP.

According to exemplary embodiments, distances between adjacent pixels in the first direction DR1 may be identical (or substantially identical) to one another. That is, a distance between the bending pixels BP in the first direction DR1 may be a first distance D1, a distance between the non-bending pixels NP in the first direction DR1 may be a second distance D2, and a distance between the bending pixels BP and the non-bending pixels NP that are adjacent to one another in the first direction DR1 may be a third distance D3. In this manner, the first distance D1, the second distance D2, and the third distance D3 may be identical (or substantially identical) to one another.

When, however, the first distance D1, the second distance D2, and the third distance D3 are not identical (or substantially identical) to one another, an observable line may present itself and display quality may be deteriorated. That is, when a different amount of non-display area is disposed between adjacent columns of pixels, the aggregated effect may cause at least one observable line of non-display area to be more readily noticeable to an observer. For example, when the first distance D1 and the second distance D2 are identical to each other and the third distance D3 is different from the first distance D1 and the second distance D2, at least one observable line may present itself between adjacent bending pixels BP and non-bending pixels NP in the first direction DR1. The observable line(s) may extend in a direction parallel (or substantially parallel) to the bending axis AX. In exemplary embodiments, however, since the first distance D1, the second distance D2, and the third distance D3 may be identical (or substantially identical) to one another, the aforementioned observable line(s) may be prevented and display quality may be improved.

According to exemplary embodiments, a method of manufacturing the foldable display apparatus 1000 of FIGS. 1 and 2 may include forming a plurality of pixels on a display substrate 100 including a bending area BA in which at least one bend may occur in a first direction DR1 at least partially about a bending axis AX and a non-bending area NA, which may not include at least one bend. At least some of the pixels may be disposed in association with the bending area BA, and, thereby, considered bending pixels BP. Other ones of the pixels may be disposed in association with the non-bending area NA, and, thereby, considered non-bending pixels NP. The relative sizes and spatial positions of the bending pixels BP and the non-bending pixels NP may be consistent with exemplary embodiments described in association with FIGS. 1 and 2, and, as such, a duplicative description will be omitted to ovoid obscuring exemplary embodiments described herein.

Figure 3:
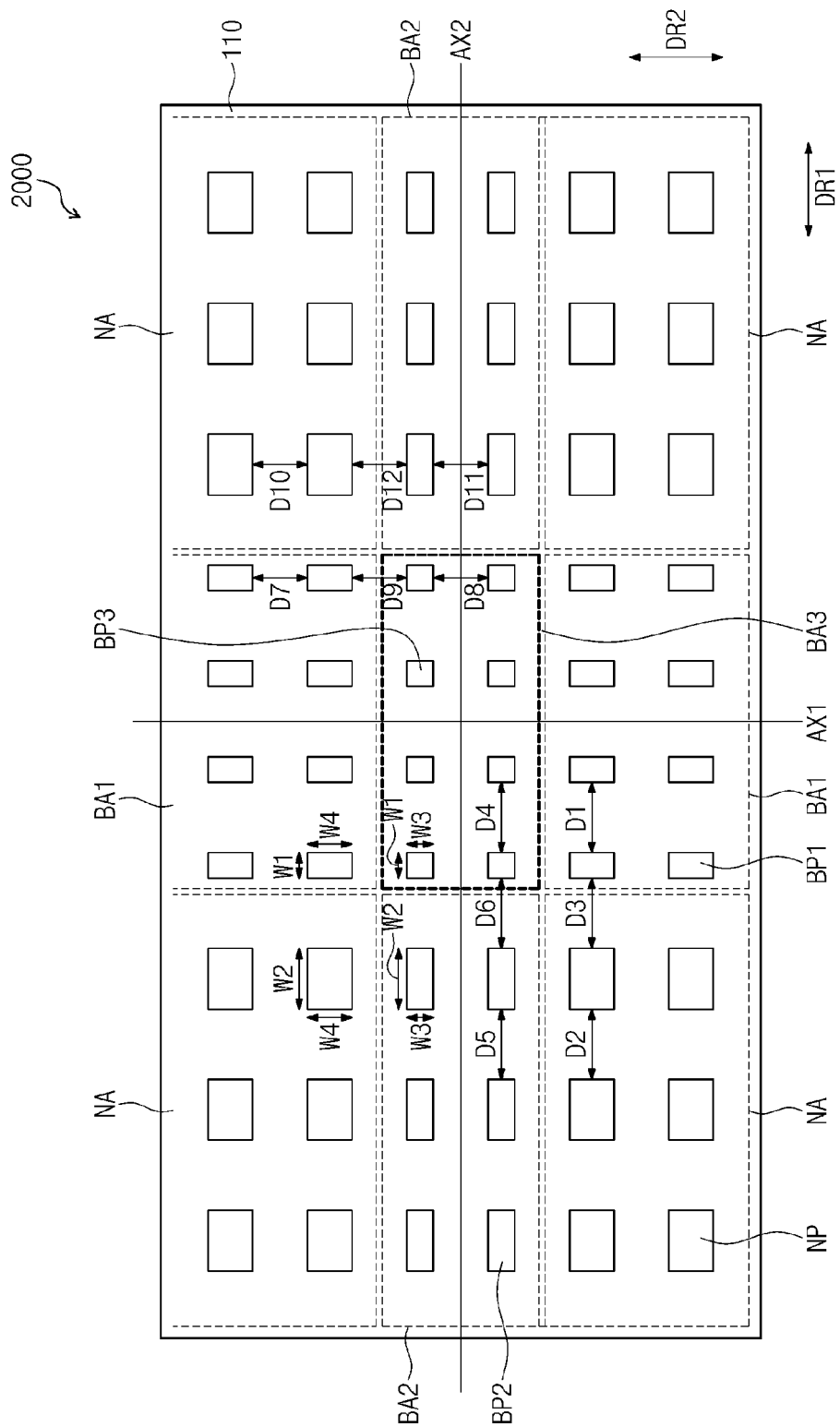
FIG. 3 is a plan view of a foldable display apparatus, according to exemplary embodiments.

FIG. 3 is a plan view of a foldable display apparatus, according to exemplary embodiments. It is noted that the foldable display apparatus 2000 of FIG. 3 may be substantially similar to the foldable display apparatus 1000 of FIGS. 1 and 2. As such, to avoid obscuring exemplary embodiments described herein, differences between the foldable display apparatus 2000 and the foldable display apparatus 1000 will be described below.

As seen in FIG. 3, the foldable display apparatus 2000 may be bent (or otherwise deformed) in a first direction DR1 at least partially about a first bending axis AX1 perpendicular (or substantially perpendicular) to the first direction DR1. The foldable display apparatus 2000 may also be bent in a second direction DR2 at least partially about a second bending axis AX2, which may be perpendicular (or substantially perpendicular) to the second direction DR2. In this manner, the first bending axis AX1 and the second bending axis AX2 may cross one another, as may the first direction DR1 and the second direction DR2. To this end, the first bending axis AX1 may extend (or substantially extend) in the second direction DR2, whereas the second bending axis AX2 may extend (or substantially extend) in the first direction DR1.

According to exemplary embodiments, the foldable display apparatus 2000 may include a display substrate 110. The display substrate 110 may include first bending areas BA1, second bending areas BA2, a third bending area BA3, and non-bending areas NA. It is noted that the first bending areas BA1 may be bent in the first direction DR1 at least partially about the first bending axis AX1, but may not be bent in the second direction DR2. To this end, the second bending areas BA2 may be bent in the second direction DR2 at least partially about the second bending axis AX2, but may not be bent in the first direction DR1. The third bending area BA3 may be bent in the first direction DR1 at least partially about the first bending axis AX1 and bent in the second direction DR2 at least partially about the second bending axis AX2. Further, the non-bending areas NA may not include a bend in either of the first direction DR1 or the second direction DR2.

In exemplary embodiments, the foldable display apparatus 2000 includes a plurality of pixels disposed on the display substrate 110. The plurality of pixels includes first bending pixels BP1 disposed in the first bending areas BA1, second bending pixels BP2 disposed in the second bending areas BA2, third bending pixels BP3 disposed in the third bending area BA3, and non-bending pixels NP disposed in the non-bending areas NA. Widths of the respective first bending pixels BP1 and the respective third bending pixels BP3 in the first direction DR1 may be first widths W1, and widths of the respective second bending pixels BP2 and the respective non-bending pixels NP in the first direction DR1 may be second widths W2. In this manner, the first width W1 may be smaller than the second width W2. A relation between the first width W1 and the second width W2 may satisfy Equation 1 described above.

A radius of curvature of the first bending areas BA1 at least partially about the first bending axis AX1 may be proportional to the first width W1. For example, as the radius of curvature of the first bending areas BA1 becomes smaller, the first width W1 may become smaller.

According to exemplary embodiments, widths of the respective second bending pixels BP2 and the respective third bending pixels BP3 in the second direction DR2 may be third widths W3, and widths of the respective first bending pixels BP1 and the respective non-bending pixels NP in the second direction DR2 may be fourth widths W4. In this manner, the third width W3 may be smaller than the fourth width W4. That is, a relation between the third width W3 and the fourth width W4 may satisfy Equation 2.

$$0.1 \times W4 \leq W3 \leq 0.9 \times W4 \qquad \text{Equation (2)}$$

A radius of curvature of the second bending areas BA2 at least partially about the second bending axis may be proportional to the third width W3. For example, as the radius of curvature of the second bending areas BA2 becomes smaller, the third width W3 may become smaller.

In exemplary embodiments, distances between adjacent pixels in the first direction DR1 may be identical to one another. Distances between adjacent pixels in the second direction DR2 may be identical to one another.

A distance between the first bending pixels BP1 in the first direction DR1 may be a first distance D1, a distance between the non-bending pixels NP in the first direction DR1 may be a second distance D2, a distance between the first bending pixels BP1 and the non-bending pixels NP adjacent to one another in the first direction D1 may be a third distance D3, a distance between the third bending pixels BP3 in the first direction DR1 may be a fourth distance D4, a distance between the second bending pixels BP2 in the first direction DR1 may be a fifth distance D5, and a distance between the second bending pixels BP2 and the third bending pixels BP3 adjacent to one another in the first direction DR1 may be a sixth distance D6. To this end, the first distance D1, the second distance D2, the third distance D3, the fourth distance D4, the fifth distance D5, and the sixth distance D6 may be identical to one another.

A distance between the first bending pixels BP1 in the second direction DR2 may be a seventh distance D7, a distance between the third bending pixels BP3 in the second direction DR2 may be an eighth distance D8, a distance between the first bending pixels BP1 and the third bending pixels BP3 adjacent to one another in the second direction DR2 may be a ninth distance D9, a distance between the non-bending pixels NP in the second direction DR2 may be a tenth distance D10, a distance between the second bending pixels BP2 in the second direction DR2 may be an eleventh distance D11, and a distance between the non-bending pixels NP and the second bending pixels BP2 adjacent to one another in the second direction DR2 may be a twelfth distance D12. To this end, the seventh distance D7, the eighth distance D8, the ninth distance D9, the tenth distance D10, the eleventh distance D11, and the twelfth distance D12 may be identical to one another.

According to exemplary embodiments, the configuration of the foldable display apparatus 2000 of FIG. 3 may not only reduce a probability of defects occurring in the first bending pixels BP1 and the third bending pixels BP3, but may also reduce a probability of defects occurring in the second bending pixels BP2 and the third bending pixels BP3. To this end, exemplary embodiments not only prevent observable lines extending in the second direction DR2 from being noticed due to the first distance D1 to the sixth distance D6 being identical to one another, but also prevent observable lines extending in the first direction DR1 from being noticed due to the seventh distance D7 to the twelfth distance D12 being identical to one another. In this manner, display quality may be improved.

According to exemplary embodiments, a method of manufacturing the foldable display apparatus 2000 of FIG. 3 may include forming a plurality of pixels on a display substrate 110 including first bending areas BA1 in which at least one bend occurs in a first direction DR1 at least partially about a first bending axis AX1, second bending areas BA2 in which at least one bend occurs in a second direction DR2 at least partially about a second bending axis AX2 (where the second direction DR2 crosses the first direction DR1), a third bending area BA3 in which at least one bend occurs in each of the first direction DR1 and the second direction DR2 at least partially about the first bending axis AX1 and the second bending axis AX2, respectively, and non-bending areas NA, which may not include at least one bend. Each of the first bending areas BA1, the second bending areas BA2, the third bending area BA3, and the non-bending areas NA may respectively include corresponding ones of the pixels. That is, the first bending areas BA1 may include first bending pixels BP1, the second bending areas BA2 may include second bending pixels BP2, the third bending area BA3 may include third bending pixels BP3, and the non-bending areas NA may include non-bending pixels NP. The relative sizes and spatial positions of the first bending pixels BP1, the second bending pixels BP2, the third bending pixels BP3, and the non-bending pixels NP may be consistent with exemplary embodiments described in association with FIGS. 1 to 3, and, as such, a duplicative description will be omitted to avoid obscuring exemplary embodiments described herein.

According to exemplary embodiments, cracks may be prevented (or otherwise reduced) from occurring in pixels formed in one or more bent areas of a foldable display apparatus. To this end, exemplary embodiments may also prevent the occurrence of one or more lines from being formed in directions substantially parallel to bending axes of the bent areas that may otherwise be observed. In this manner, exemplary embodiments may improve display quality of foldable display apparatuses.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display apparatus, comprising:
a flexible substrate comprising:
 a first area at least partially bent about an axis; and
 at least one non-bent area;
first pixels disposed in the first area; and
second pixels disposed in the at least one non-bent area,
wherein the first pixels have the same size as one another,
wherein the second pixels have the same size as one another,
wherein respective widths of each first pixel in a first direction are smaller than respective widths of each second pixel in the first direction, and
wherein a distance between first pixels adjacent to one another in the first direction, a distance between second pixels adjacent to one another in the first direction, and a distance between first pixels and second pixels adjacent to one another in the first direction are the same as one another.

2. The display apparatus of claim 1, wherein:
the respective width of each first pixel in the first direction is W1;
the respective width of each second pixel in the first direction is W2; and $$0.1 \times W2 \leq W1 \leq 0.9 \times W2.$$

3. The display apparatus of claim 1, wherein the first direction is substantially perpendicular to the axis.

4. A display apparatus, comprising:
a flexible substrate comprising:
 a first area at least partially bent about a first axis,
 a second area at least partially bent about a second axis different from the first axis,
 a third area at least partially bent about each of the first axis and the second axis, and
 at least one non-bent area;
first pixels disposed in the first area;
second pixels disposed in the second area;
third pixels disposed in the third area; and
fourth pixels disposed in the at least one non-bent area,
wherein the first pixels have the same size as one another,
wherein the second pixels have the same size as one another,
wherein the third pixels have the same size as one another,
wherein the fourth pixels have the same size as one another,
wherein respective widths of each first pixel and each third pixel in a first direction are smaller than respective widths of each fourth pixel and each second pixel in the first direction, and
wherein respective widths of each second pixel and each third pixel in a second direction different from the first direction are smaller than respective widths of each fourth pixel and each first pixel in the second direction.

5. The display apparatus of claim 4, wherein a distance between first pixels adjacent to one another in the first direction, a distance between fourth pixels adjacent to one another in the first direction, a distance between first pixels and fourth pixels adjacent to one another in the first direction, a distance between third pixels adjacent to one another in the first direction, a distance between second pixels adjacent to one another in the first direction, and a distance between second pixels and third pixels adjacent to one another in the first direction are substantially the same.

6. The display apparatus of claim 4, wherein a distance between first pixels adjacent to one another in the second direction, a distance between third pixels adjacent to one another in the second direction, a distance between first pixels and third pixels adjacent to one another in the second direction, a distance between fourth pixels adjacent to one another in the second direction, a distance between second pixels adjacent to one another in the second direction, and a distance between fourth pixels and second pixels adjacent to one another in the second direction are substantially the same.

7. The display apparatus of claim 4, wherein:
the respective widths of each first pixel and each third pixel in the first direction are W1;
the respective widths of each second pixel and each fourth pixel in the first direction are W2; and $$0.1 \times W2 \leq W1 \leq 0.9 \times W2.$$

8. The display apparatus of claim 4, wherein:
the respective widths of each second pixel and each third pixel in the second direction are W3;
the respective widths of each first pixel and each fourth pixel in the second direction are W4; and $$0.1 \times W4 \leq W3 \leq 0.9 \times W4.$$

9. The display apparatus of claim 4, wherein:
the first direction is substantially perpendicular to the first axis;
the second direction is substantially perpendicular to the second axis;
the first direction and the second axis are substantially parallel; and
the second direction and the first axis are substantially parallel.

10. A method, comprising:
forming first pixels on a first portion of a flexible substrate;
forming second pixels on a second portion of the flexible substrate; and
bending the first portion of the flexible substrate at least partially about an axis,
wherein the first pixels have the same size as one another,
wherein the second pixels have the same size as one another,
wherein respective widths of each first pixel in a first direction are smaller than respective widths of each second pixel in the first direction, and
wherein a distance between first pixels adjacent to one another in the first direction, a distance between second pixels adjacent to one another in the first direction, and a distance between first pixels and second pixels adjacent to one another in the first direction are substantially the same.

11. The method of claim 10, wherein:
the respective width of each first pixel in the first direction is W1;
the respective width of each second pixel in the first direction is W2; and $0.1 \times W2 \leq W1 \leq 0.9 \times W2.$ 12. The method of claim 10, wherein the first direction is substantially perpendicular to the axis.

13. A method, comprising:
forming first pixels on a first portion of a flexible substrate;
forming second pixels on a second portion of the flexible substrate;
forming third pixels on a third portion of the flexible substrate;
forming fourth pixels on a fourth portion of the flexible substrate;
bending the first portion at least partially about a first axis; and
bending the second portion at least partially about a second axis different from the first axis,
wherein bending the first portion and bending the second portion bends the third portion at least partially about each of the first axis and the second axis,
wherein the first pixels have the same size as one another,
wherein the second pixels have the same size as one another,
wherein the third pixels have the same size as one another,
wherein the fourth pixels have the same size as one another,
wherein respective widths of each first pixel and each third pixel in a first direction are smaller than respective widths of each fourth pixel and each second pixel in the first direction, and
wherein respective widths of each second pixel and each third pixel in a second direction different from the first direction are smaller than respective widths of each fourth pixel and each first pixel in the second direction.

14. The method of claim 13, wherein a distance between first pixels adjacent to one another in the first direction, a distance between fourth pixels adjacent to one another in the first direction, a distance between first pixels and fourth pixels adjacent to one another in the first direction, a distance between third pixels adjacent to one another in the first direction, a distance between second pixels adjacent to one another in the first direction, and a distance between second pixels and third pixels adjacent to one another in the first direction are substantially the same.

15. The method of claim 13, wherein a distance between first pixels adjacent to one another in the second direction, a distance between third pixels adjacent to one another in the second direction, a distance between first pixels and third pixels adjacent to one another in the second direction, a distance between fourth pixels adjacent to one another in the second direction, a distance between second pixels adjacent to one another in the second direction, and a distance between fourth pixels and second pixels adjacent to one another in the second direction are substantially the same.

16. The method of claim 13, wherein:
the respective widths of each first pixel and each third pixel in the first direction are W1;
the respective widths of each second pixel and each fourth pixel in the first direction are W2; and $0.1 \times W2 \leq W1 \leq 0.9 \times W2.$ 17. The method of claim 13, wherein:
the respective widths of each second pixel and each third pixel in the second direction are W3;
the respective widths of each first pixel and each fourth pixel in the second direction are W4; and $0.1 \times W4 \leq W3 \leq 0.9 \times W4.$ 18. The method of claim 13, wherein:
the first direction is substantially perpendicular to the first axis;
the second direction is substantially perpendicular to the second axis;
the first direction and the second axis are substantially parallel; and
the second direction and the first axis are substantially parallel.

* * * * *